United States Patent
Ong et al.

(10) Patent No.: US 6,656,320 B2
(45) Date of Patent: Dec. 2, 2003

(54) REMOVAL OF MASKING TAPE FROM LEAD FRAMES

(75) Inventors: See Yap Ong, Singapore (SG); Tong Heng Cheah, Singapore (SG); Shu Chuen Ho, Singapore (SG); Teng Hock Kuah, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 195 days.

(21) Appl. No.: 09/901,141

(22) Filed: Jul. 10, 2001

(65) Prior Publication Data

US 2003/0010444 A1 Jan. 16, 2003

(51) Int. Cl.[7] .............................................. B32B 35/00
(52) U.S. Cl. ...................... 156/344; 156/584; 29/426.3; 29/426.5
(58) Field of Search ................................. 156/344, 584; 29/426.1, 426.3, 426.5

(56) References Cited

U.S. PATENT DOCUMENTS

| | | | | |
|---|---|---|---|---|
| 3,936,343 A | * | 2/1976 | Walls ........................... | 156/368 |
| 4,173,510 A | * | 11/1979 | Tobey .......................... | 156/584 |
| 4,177,104 A | * | 12/1979 | Parker ......................... | 156/584 |
| 4,183,751 A | * | 1/1980 | Matsumoto et al. ........ | 430/258 |
| 4,391,038 A | * | 7/1983 | Greene et al. ............... | 29/829 |
| 4,795,413 A | * | 1/1989 | Johnson et al. ............. | 493/309 |
| 4,828,640 A | * | 5/1989 | Kaya et al. .................. | 156/248 |
| 5,108,534 A | * | 4/1992 | Tveit et al. .................. | 156/344 |
| 5,282,918 A | * | 2/1994 | Heist et al. .................. | 156/344 |
| 5,545,282 A | * | 8/1996 | Bechmann .................... | 156/344 |
| 5,656,127 A | * | 8/1997 | De Niel et al. ............. | 156/584 |
| 5,861,077 A | * | 1/1999 | Kamijo et al. .............. | 156/344 |
| 6,068,727 A | * | 5/2000 | Weaver et al. .............. | 156/344 |
| 6,397,457 B1 | * | 6/2002 | Wuyts .......................... | 29/762 |
| 6,444,082 B1 | * | 9/2002 | Campbell et al. ........... | 156/344 |
| 6,503,130 B2 | * | 1/2003 | Lim ............................. | 451/285 |

FOREIGN PATENT DOCUMENTS

JP            63-288721      * 11/1988   ................. 156/584

* cited by examiner

*Primary Examiner*—Mark A. Osele
(74) *Attorney, Agent, or Firm*—Morrison & Foerster, LLP (57) ABSTRACT

A resin body is moulded around a die located on the front surface of a lead frame, and subsequently masking tape adhered to the rear surface of the lead frame is peeled away. While the tape is peeled away, the front surface of the lead frame is clamped by a surface which contains, or which can be deformed to contain, a recess for receiving the resin body. The peeling is performed by firstly separating an edge portion of the tape from the lead frame by a diagonal motion; and subsequently moving the edge portion across the lead frame so as to peel back the tape until its adhered surface faces away from the lead frame. A retrieval plate is urged against the adhered surface, so that the adhered surface becomes adhered to the retrieval plate. This process is repeated for successive lead frames, so that a stack of masking tape sections is formed on the retrieval plate.

19 Claims, 4 Drawing Sheets

REMOVAL OF MASKING TAPE FROM LEAD FRAMES

FIELD OF THE INVENTION

The present invention relates to masking tape adhered to the rear surface of a lead frame to protect that rear surface while a die attached to the front surface of the lead frame is embedded in resin. In particular, the invention relates to methods and apparatus for removal of the masking tape.

BACKGROUND OF THE INVENTION

Following attachment of a die (that is an integrated circuit package) to a front surface of a lead frame, it is conventional to encase the die in resin by a moulding process. This is carried out by placing the lead frame at the bottom of a mould, with the front surface of the lead frame facing upwardly. Liquid resin is inserted into the mould so that the die is submerged in it. Gradually the resin hardens so as to encase the die. It is highly preferable to prevent the resin from contaminating the rear surface of the lead frame (i.e. the surface facing away from the die), particularly because, when the die is subsequently in use, resin on the rear surface may inhibit the escape through that surface of heat generated within the die.

For this reason, it is known to adhere masking tape to the rear surface of the lead frame during the moulding process. After the moulding is complete, the lead frame is inverted so that the rear surface is uppermost, the tape is removed from the rear surface by tearing it away, and a vacuum source is used to suck the discarded tape away for disposal. Once the tape has been removed, further process steps, such as post-mould curing may be conveniently carried out.

The present inventors have now appreciated that this known process involves a number of disadvantages. Firstly, the tearing process may subject the die to sufficiently severe mechanical stresses to risk damage to the die. Secondly, the process of turning the lead frame over complicates the process, and thus increases its cost. Thirdly, since the discarded tapes still carry adhesive they retain a stickiness, and can "gum up" the operation of the vacuum source.

SUMMARY OF THE INVENTION

The present invention seeks to provide new and useful methods and apparatus for removing the masking tape from the rear surface of a lead frame following the moulding of resin to the front surface of the lead frame.

In a first aspect, the invention proposes that while the masking tape is peeled away, the lead frame is clamped by a clamping surface which presses on the front surface of the lead frame. To reduce the risk of damage to the die and lead frame (and the connections between them), the clamping surfaces either includes recess(es) for receiving the moulded resin body (or bodies), or is deformable to create such recesses. Thus, clamping force is transmitted to the lead frame other than entirely through the resin bodies.

Specifically, a first aspect of the invention is a method of removing a section of masking tape adhered to a rear surface of a lead frame, at least one die being provided on a front surface of the lead frame opposite the rear face, the die being encased in a moulded resin body, the method comprising the steps of:
supporting the lead frame on its rear surface;
urging a clamping surface of a clamp plate towards the front surface of the lead frame to clamp the lead frame, the clamping surface receiving the or each resin body within at least one recess in the clamping surface; and
peeling the masking tape from the rear surface of the lead frame.

Note that clamping the lead frame makes it possible to peel the masking tape away from the lead frame while the rear surface of the lead frame is still facing downwardly. In other words, it is unnecessary according to the invention to invert the lead frame after the moulding and before the peeling step. This significantly reduces the complexity, and hence the cost, of the process step.

Furthermore, the clamping method ensures that clamping force is distributed widely over the front surface of the lead frame, much reducing the chance that damage will be caused to the lead frame during the peeling process by a concentration of force.

A second aspect of the invention proposes in general terms that the peeling itself is conducted in a two-stage automatic process. In a first stage an edge of the masking tape is separated from the lead frame by a first motion which is does not stretch it (e.g. a substantially diagonal motion). In a second stage the masking tape is peeled back from the lead frame by a second motion parallel to the rear surface of the frame.

Specifically, in the second aspect the invention proposes a method of removing a section of masking tape adhered to the rear surface of a lead frame and extending in a first direction parallel to the rear surface of the lead frame, the method comprising:

attaching a gripping device to an edge portion of the tape which is furthermost in the first direction;

moving the gripping device relative to the lead frame by a predetermined distance in a direction having a first component opposite to the first direction and a second component away from the surface, whereby the edge portion of the tape is moved away from the lead frame by a predefined distance; and moving the gripping device relative to the lead frame oppositely to the first direction, whereby the masking tape is gradually peeled from the rear surface of the lead frame.

A third aspect of the invention relates in general terms to the disposal of the masking tape after it is peeled from the lead frame. Instead of sucking it away with a vacuum source, the third aspect of the invention proposes that the surface of the masking tape which was previously adhered to the lead frame (and which will still generally be covered with adhesive) is adhered to a retrieval surface pressed against it. Thus, the second surface of the masking tape (i.e. the one which was not adhered to the lead frame) would then face away from the retrieval surface.

Subsequently, when the masking tape of the next lead frame has been peeled away, its side which is covered with adhesive is pressed against the second surface of the first masking tape, and adhered to it. In this way a stack of masking tapes can be built up. All the masking tapes can then be disposed of together. No vacuum source is required, and in particular none is required while the dies and lead frames are still being processed.

Specifically, a first expression of the third aspect of the invention is a method of removing a section of masking tape from a lead frame, the masking tape having a first surface adhered to a rear surface of the lead frame and extending in a first direction parallel to the rear surface of the lead frame, the method comprising:

gripping an edge portion of the masking tape which is furthermost in the first direction, peeling the masking tape from the lead frame by moving the edge portion opposite to the first direction, whereby the first surface of the masking tape is turned to face away from the lead frame; and urging a retrieval surface of a retrieval plate against the first surface of the masking tape, whereby the masking tape becomes adhered to the retrieval surface.

Taking into account the possibility of stacking multiple tapes, an alternative expression of the third aspect of the invention is a method of removing respective sections of masking tape from respective rear faces of a plurality of lead frames, each section of masking tape having a first surface adhered to the rear surface of the respective lead frame and extending in a first direction parallel to the rear surface of the lead frame, the method comprising:

(i) gripping an edge portion of the masking tape of the first lead frame, the edge portion being furthermost in the first direction, (ii) peeling the masking tape from the first lead frame by moving the edge portion oppositely to the first direction, whereby the first surface of the masking tape is turned to face away from the lead frame;

(iii) urging a retrieval surface of a retrieval plate towards the first surface of the masking tape, whereby the masking tape of the first lead frame becomes adhered to the retrieving surface; and (iv) repeating steps (i) to (iii) successively for the other lead frames, in each step (iii) the masking tape of the respective lead frame becoming adhered to the masking tape of the previous lead frame, whereby the masking tapes of the plurality of lead frames are successively stacked on the retrieval surface.

Note that the three aspects of the invention are freely combinable. For example, the peeling and disposal concepts which are the second and third aspects of the invention are preferably carried out while the lead frame is clamped according to the first aspect of the invention. Similarly, the disposal which is the third aspect of the invention is carried out after a peeling step which is preferably, but not necessarily, according to the second aspect of the invention.

Although the invention has been described above in terms of methods, it can equally well be expressed in term of apparatus for automatically carrying out the various methods.

BRIEF DESCRIPTION OF THE FIGURES

An embodiment of the invention will now be described for the sake of example only with reference to the following figures in which.

DETAILED DESCRIPTION OF THE EMBODIMENT

FIG. 1(a) shows a portion of the embodiment responsible for the clamping action. FIG. 1(b) shows the same portion of the embodiment, as seen from the direction which is to the right in FIG. 1(a). However, as explained in detail below, the configuration of the portions is different in FIGS. 1(a) and 1(b).

A frame 1 supports an assembly 3 consisting of guides 5 for rods 7, and a pneumatic cylinder 9. The lower ends of the rods 7 and the pneumatic cylinder 9 project through the frame 1. The rods 7 are connected to a backing member 11, so that the backing member 11 is constrained to vertical motion (i.e. parallel the axes of the guides 5).

Fixed to the backing member 11 are adjustable pre-load screws 13, which selectively fix the distance between the backing member 11 and a support member 15. A clamp plate 17 is fixed to the underside of the backing member 15. Thus, the clamp plate 17 can be moved vertically up and down by action of the pneumatic cylinder 9 bearing on the backing member 11, which in turn moves the support member 15. The screws 13 can be turned to different respective extents to adjust the orientation of the support member 15, e.g. to correct for departures of the axis of the guides 5 from the vertical. The screws 13 provide for stable clamping (or constant pressure) over the whole lead frame.

The lower surface (clamping surface) 19 of the clamp plate 17 is formed with a recess 20. The clamp plate 17 is vertically above a section 21 of the frame 1 which supports the lead frame 23 within a recess 25 of the section 21. In FIG. 1(a) the clamp plate is vertically spaced from the lead frame 23, but in FIG. 1(b) due to the pressing action of the pneumatic cylinder 9, the clamp plate has been urged towards the lead frame 23, and into the recess 25.

Figure 1:
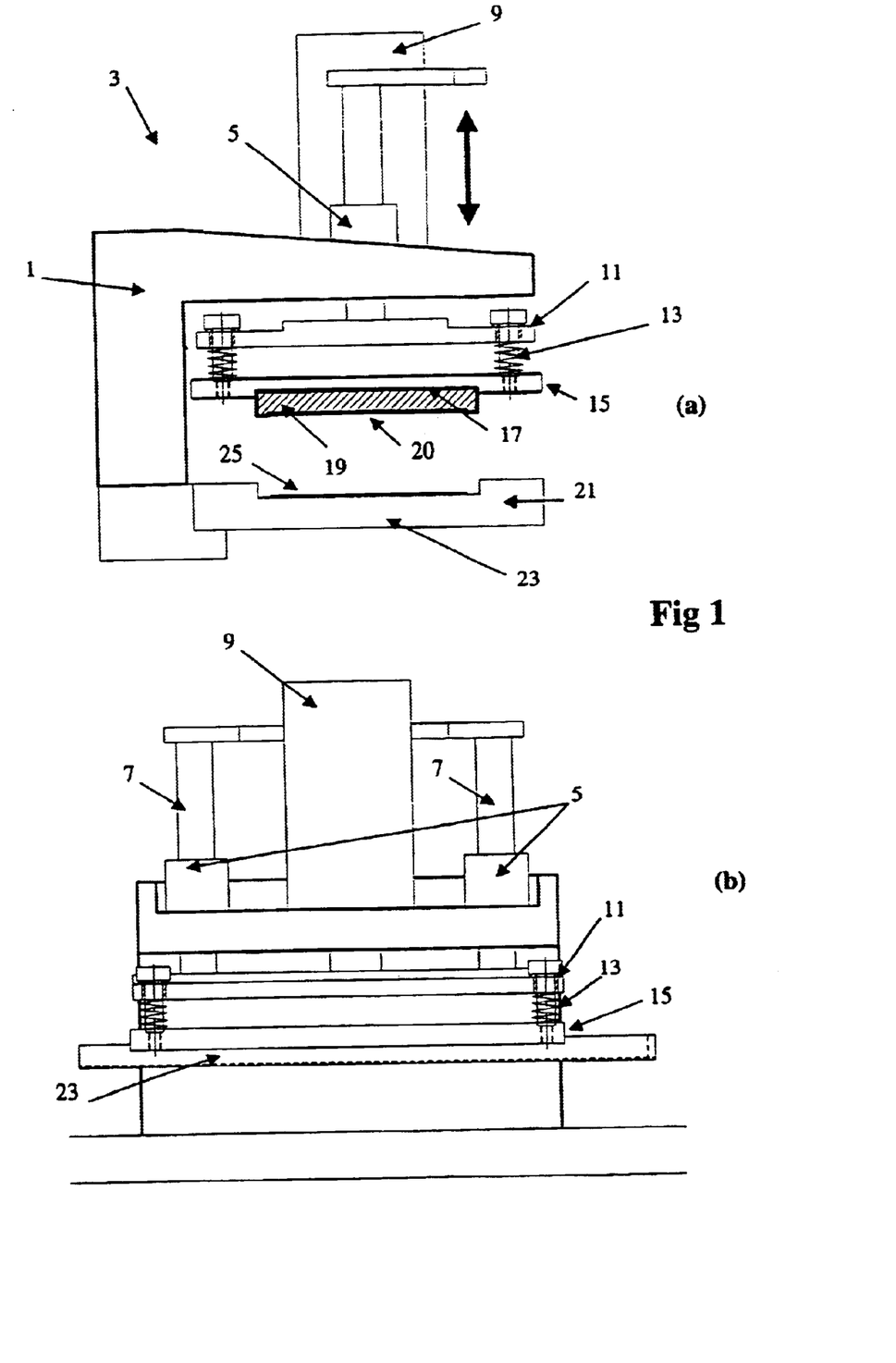
FIG. 1, which is composed of FIGS. 1(a) and 1(b), illustrates clamping of the lead frame in an embodiment of the invention.

The lead frame 23 is of a conventional form. As indicated in FIG. 1(b), the lead frame may contain multiple apertures, as is conventional. Although not shown in the figures, the lead frame 23 has already been electronically connected to one or more dies provided on its front (upper in the FIG. 1) surface. For example, the die may be a QFN (Quad Flatpack No-Leads) die and the lead frame may be a QFN lead frame. Wires have been provided connecting points of the lead frame to appropriate corresponding points on the die pad in the conventional way. One or more resin bodies have then been formed by moulding on the front surface of the lead frame 23 according to conventional methods, encasing the die or dies. Note that the resin body (or bodies) will normally not already have been hardened by curing. A tape 31 (not shown in FIG. 1) is provided on the rear surface of the lead frame (that is, the lower one in FIG. 1).

The recess 20 in the clamping plate 17 is selected such that the resin body (or bodies) on the lead frame 23 enter the recess 20, so that the force applied to the lead frame 23 is applied only, or at least mainly, to areas of the lead frame which are not covered by the resin body (or bodies).

Preferably, the location and shape of the recess 20 are selected taking into account the location of the resin body (or bodies) on the front surface of the lead frame 23. The configuration of the clamping surface 19 of the clamp plate 17 may be "product related", that is selected to correspond to the specific lead frame 23 and its load. Note that in the case that there are multiple resin bodies on the lead frame, multiple recesses 19 may be provided.

The material of the clamp plate 17 should be soft (resilient). This means that the pre-load screws control the maximum downward force which the clamp plate 17 can apply to the lead frame 23, since this maximum force is determined by the lowest position of the support member 15 and the resilience of the clamp plate 17. Indeed, in a variant of the embodiment within the scope of the invention, the clamping surface 19 does not contain recesses 20 until it is forced against the front surface of the lead frame 23, and the recesses are formed simply by deformation of the resilient clamping surface 19.

Once the clamp plate 17 is forced into the lower position, such that the lead frame is clamped firmly, the removal of the tape 31 can begin. This is explained in detail with respect to FIGS. 2 and 3.

Figure 2:
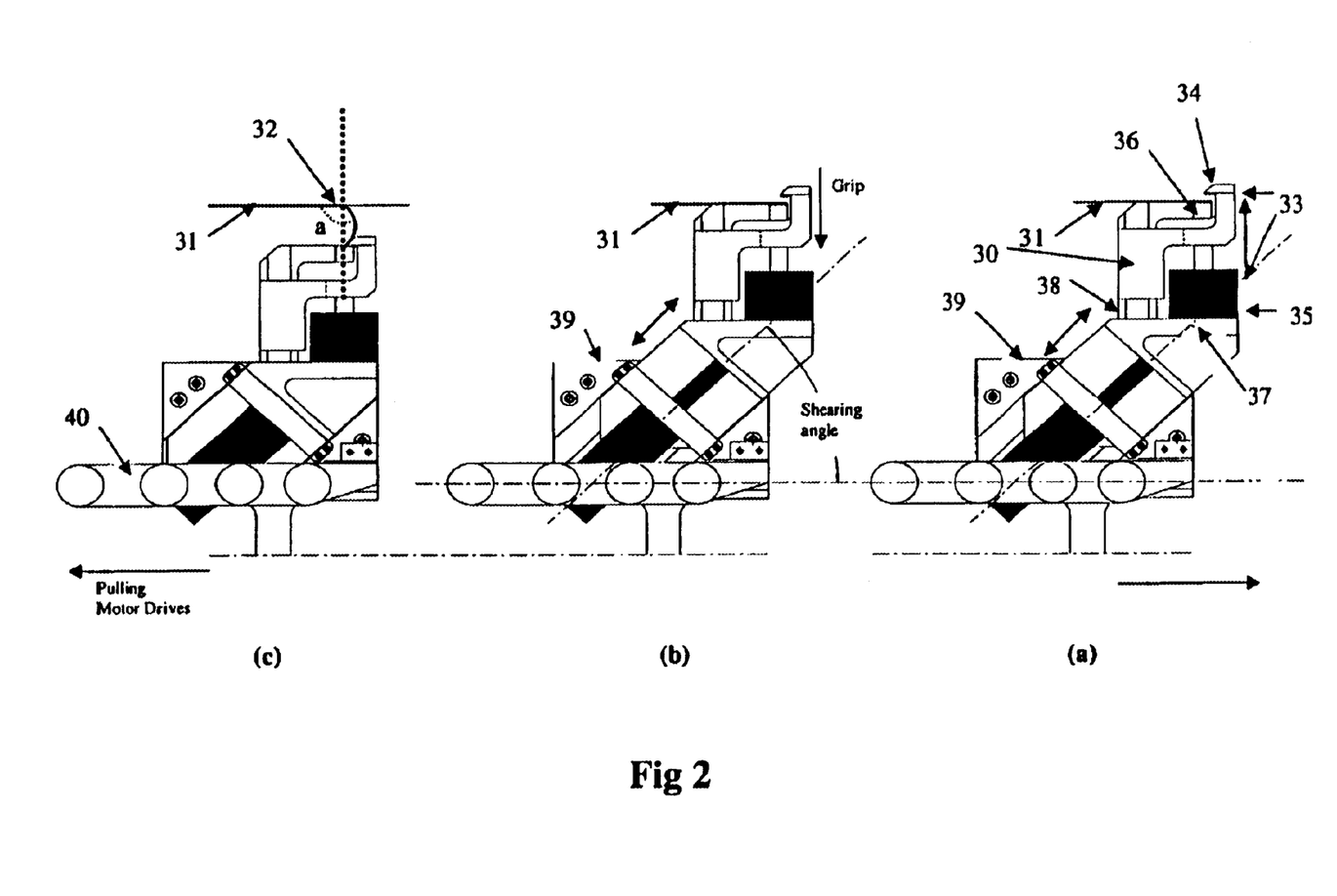
FIG. 2, which is composed of FIGS. 2(a), 2(b) and 2(c), illustrates peeling of masking tape in the embodiment of FIG. 1.

FIG. 2 shows, in FIGS. 2(a), 2(b) and 2(c), the sequence of steps by which the tape 31 is peeled from the lead frame. In FIG. 2 the lead frame 23 is not shown, but it lies generally above the masking tape 31. The masking tape extends in a first direction (to the right in FIG. 2(a)) in which it has greatest length. The width direction of the tape is into the page in FIG. 2. The thickness direction of the tape is up-down in FIG. 2.

The peeling employs a gripping device 33 which includes a stiff lip 34 formed at the upper end of a member 30. The member 30 is slidable vertically up and down on linear guides 38 which are mounted on a support 37. The gripping device 33 further includes a vertical drive means 35 which is a pneumatic cylinder mounted on support 37, and which bears on the member 30 to drive it up or down. In doing this the stiff lip 34 is moved towards or away from an upper surface 36 of the gripping device 33 which is in fixed relation to the support 37.

The support 37 can be moved reciprocally in a diagonal direction by a drive means 39 which is a pneumatic cylinder. The drive means 39 is mounted on a post 60 can be moved horizontally be a further drive means (not shown in FIG. 2), which may also be a pneumatic cylinder. The arrangement includes trunking 40 for routing wires. Thus, the gripping device 33 is potentially subject to two independent external motions actuated by the drive means 39 and the drive means driving the post 60, plus the one internal motion actuated by the drive means 35.

Firstly, as shown in FIG. 2(a) the drive means 39 and 35 are used to hook the lip 34 over an edge of the masking tape 31. This edge is the portion of the masking tape 31 which is furthest to the right. Note that this edge portion of the masking tape may previously have been detached from the lead frame by a method which is beyond the scope of this document. Alternatively, the lead frame may be formed with a recessed area in a location along its right-most edge (i.e. the edge of the lead frame which is directed into the page in FIG. 2(a)) corresponding to the location where the lip 34 contacts the tape 31, so that this part of the edge portion of the tape 31 was never actually adhered to the lead frame 23.

Then, as indicated in FIG. 2(b) the gripping device 33 is lowered using the drive means 35, pinching the edge portion of the masking tape 31 between the lip 34 and the support 36. Thus, the gripping device 33 has been attached to the edge of the masking tape 31. Note that the lower surface of the lip 34 (and the upper surface 36) should be flat, to a specified level, in order to provide tight and full compression of the edge portion of the masking tape 31 without tearing it.

Subsequently, the drive means 39 is actuated to move the gripping device 33 diagonally, thus drawing the end of the masking tape 31 in the same diagonal direction. The result, as shown in FIG. 2(c), is that the edge portion of the tape 31 has been pulled away from the lead frame. The shearing angle is equal to the angle between the axis of the drive means 39 and the horizontal direction in FIG. 2 (i.e. the direction parallel to the rear surface of the lead frame 23). This angle is preferably substantially 45 degrees. At the end of this motion the angle a (shown in FIG. 2(c)) between the gripped edge portion of the masking tape 31 and the lead frame 23 (as measured around the point of contact 33 between the lead frame 23 and the masking tape 31 which is the furthest to the right), is about 130 degrees.

The post 60 is now moved to the left by its drive means, so as to peel the masking tape 31 from the lead frame 23. When the post 60 has been moved horizontally to the left by a distance slightly less than twice the full extent of the tape in the first direction, almost the entire tape will have been peeled away from the lead frame 23, leaving only a residual portion 58 of the tape (shown in FIG. 4), which was formerly at the left end of the tape and is now at the right extreme of the tape, is in contact with the lead frame 23. The surface of the tape which is covered with adhesive (i.e. the surface which was formerly facing upwardly towards the lead frame 23) is now facing downwardly. The masking tape is now suspended by the edge portion (now the left-most edge) which is still gripped by the gripping device 33, and at the other end by its residual portion 58 which remains attached to the lead frame 33. The angle a has now increased to substantially 180 degrees.

Figure 3:
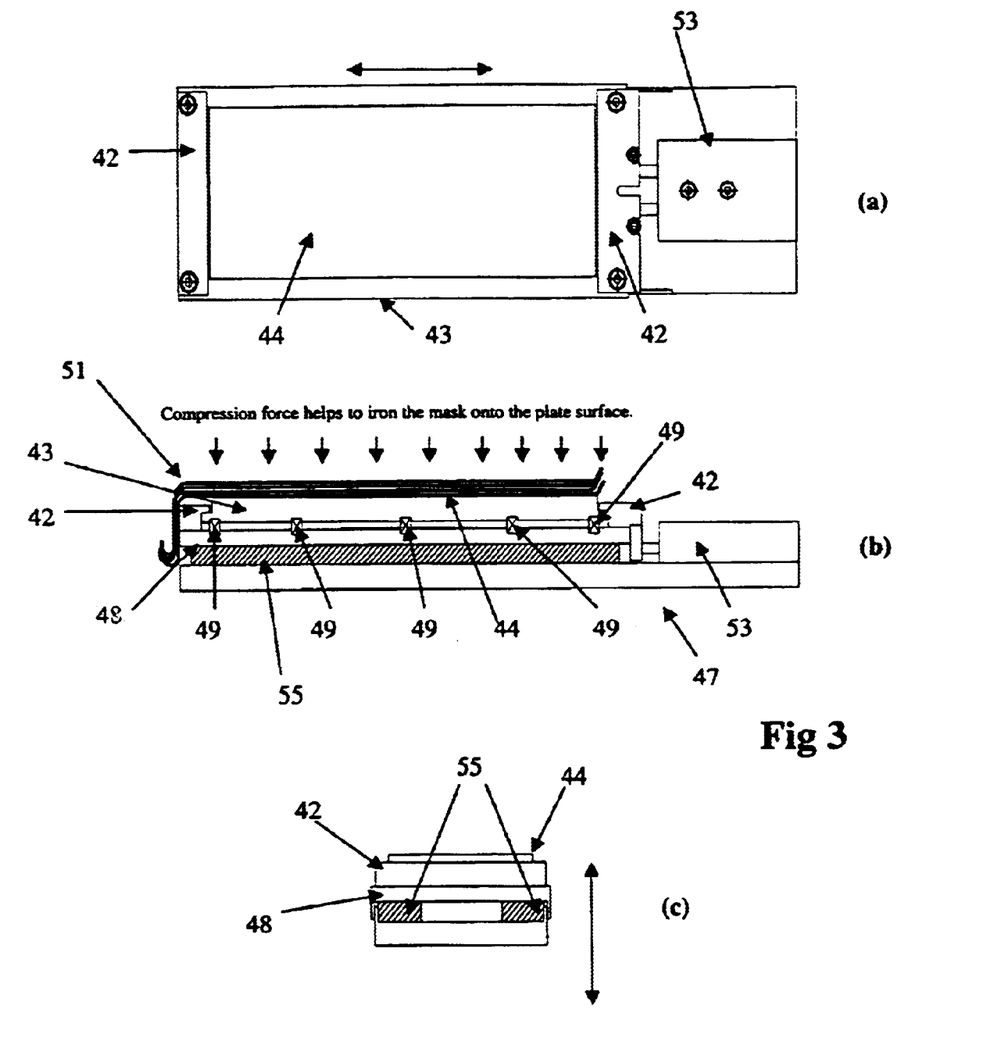
FIG. 3, which is composed of FIGS. 3(a), 3(b) and 3(c), illustrates the process of retrieving tapes in the embodiment of FIG. 1.

Turning to FIG. 3, the next step in the disposal of the masking tape is to press against it a retrieval plate 43, having a central raised upwardly-facing retrieval surface 44. As shown in FIG. 3(a), which is a view looking vertically downward, the retrieval plate 43 is clamped at each end by a clamp 42. The retrieval plate 43 is initially located vertically below and spaced from the position which the masking tape adopts when it is peeled from the lead frame. Drive means 45 (not shown in FIG. 3, but shown in FIG. 4) are provided to drive the retrieval plate 43 upward and downward. Further drive means 53 are provided mounted on the drive means 45 to drive the retrieval plate 43 in a horizontal direction.

When the retrieval plate 43 is driven upward for the first time its retrieval surface 44 is pressed against the surface of the masking tape 31 which is covered with adhesive. A compression force between the retrieval surface 44 and the mask helps to iron the mask onto the plate surface. The drive means 53 then drives the retrieval plate 43 to the left (as shown in FIG. 3), so as to finally separate the masking tape 31 from the lead frame 23.

The gripping device 33 then releases the masking tape. The retrieval plate 43 is then lowered by the drive means 45, with the adhesive sticking the masking tape 31 to the retrieval surface 44. As the drive means 45 lowers the retrieval plate, the drive means 53 moves the retrieval plate 43 back towards the right.

The portions of the embodiment shown in FIGS. 1 and 2 may now be used exactly as described above to clamp a further lead frame and to peel the masking tape from it, resulting in a new masking tape being suspended vertically above the retrieval plate 43. The drive means 45 then raises the retrieval plate again, until the upper surface of the masking tape which is already directly adhered to the retrieval surface 44 of the retrieval plate 43 is pressed against the lower surface of the new masking tape. The lower surface of the new masking tape carries adhesive, and so becomes attached to the upper surface of the previous masking tape. Once more compression force helps to iron the mask onto the retrieval surface 44. Once more the drive means 53 is used to move the retrieval plate to the left, severing the connection between the new masking tape and the lead frame. The drive means 45 then lowers the retrieval plate 43, completing the cycle.

By repeating the process many times a stack 51 of tapes is gradually built up on the retrieval plate 43.

The retrieval plate 43 is supported over the drive means 45 by an assembly 47 including sliders 55 which allow the retrieval plate 43 to move to left and right actuated by the drive means 53, and further including springs 49 supported on a base 48, which provide a cushioning effect during the compression of masking tapes against the stack 51. FIG. 3(b) is a view of this assembly, and is in a direction parallel to the views in FIG. 2. FIG. 3(c) is a view of the same assembly from the direction which is to the left of FIG. 3(b).

Figure 4:
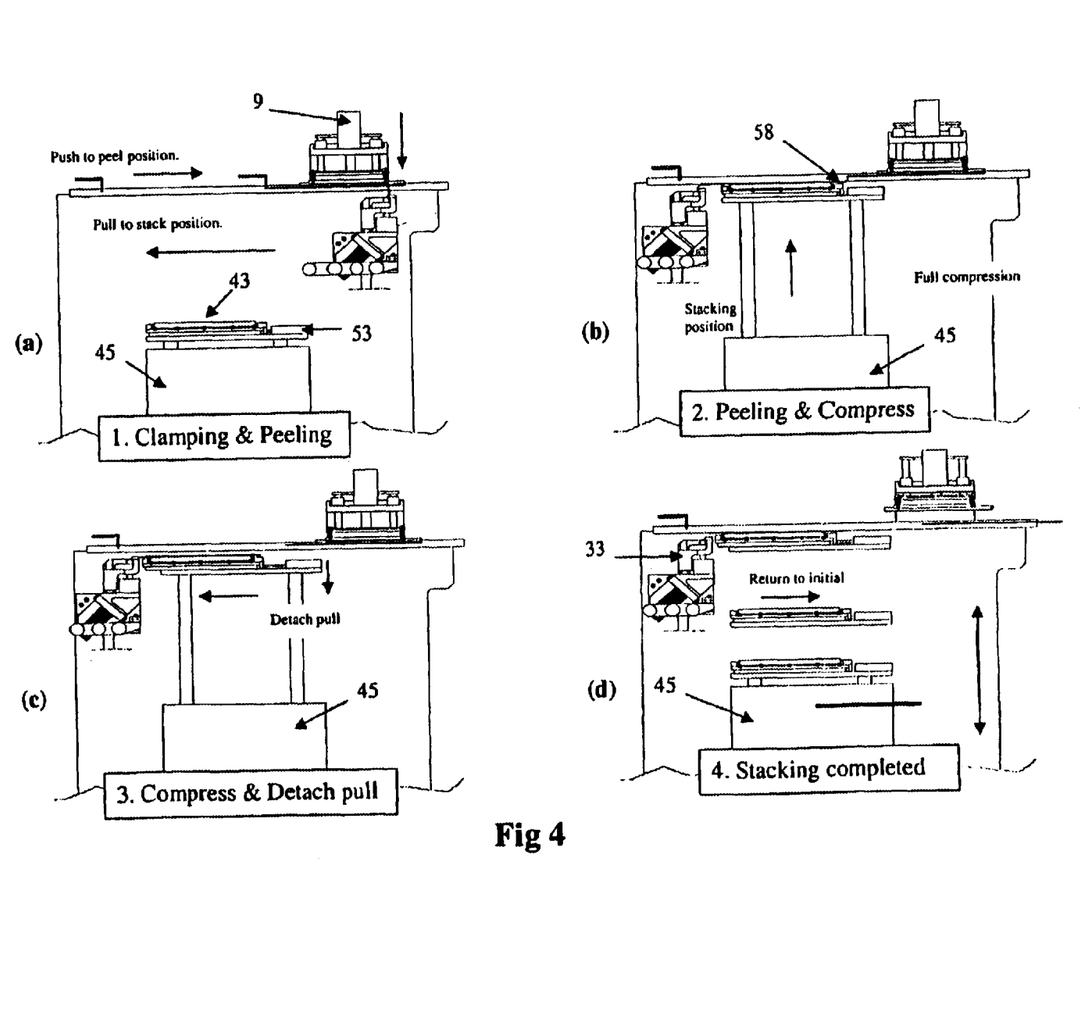
FIG. 4, which is composed of FIGS. 4(a), 4(b), 4(c) and 4(d), illustrates the whole embodiment.

FIG. 4 shows the overall operation of the embodiment FIG. 4(a) is the first step in the cycle, in which the clamp plate 17 is forced against the lead frame 23 (as shown in FIG. 1), the gripping device 33 is attached to the edge of the masking tape (as shown in FIG. 2(a)) and the edge of the masking tape is pulled diagonally (as shown in FIG. 2(b)).

FIG. 4(b) shows how the motion of the post 60 peels the masking tape 31 from the lead frame 23 leaving only an edge portion 58 of the tape in contact with the lead frame 23. The retrieval plate 43 has been forced upwards by the drive means 45, and against the surface of the masking tape which now faces downwards and which is covered with adhesive. FIG. 4(c) shows how the drive means 53 is used to move the retrieval plate 43 to the left to peel the last part of the masking tape 58 from the lead frame 23. In the final step of the cycle, the drive means 45 lowers the retrieval plate 43, and the drive means 53 draws it to the right.

Although the invention has been described above in relation to a single embodiment, many variations are possible within the scope of the invention as will be clear to a skilled reader.

We claim:

1. A method of removing a section of masking tape adhered to a rear surface of a lead frame, at least one die being provided on a front surface of the lead frame opposite the rear face, the die being encased in a moulded resin body, the method comprising the steps of:
   supporting the lead frame on its rear surface;
   urging a clamping surface of a clamp plate towards the front surface of the lead frame to clamp the lead frame, the clamping surface receiving the or each resin body within at least one recess in the clamping surface; and
   peeling the masking tape from the rear surface of the lead frame.

2. A method according to claim 1 in which the clamping surface is resilient, the at least one recess being at least partly formed by deformation of the clamping surface as it is urged towards the front face of the lead frame.

3. A method according to claim 1 or claim 2 in which the at least one recess is pre-formed in the clamping surface, the recess being shaped and located in correspondence to the shape and location of the resin body.

4. A method according to claim 1 or claim 2 in which the clamping surface is urged against the lead frame with a predetermined force.

5. A method according to claim 1 in which the rear face of the lead frame faces downwardly while the; masking tape is peeled from it.

6. An apparatus for removing a section of masking tape adhered to a rear surface of a lead frame, at least one die being provided on a front surface of the lead frame opposite the rear surface, the die being encased in a moulded resin body, the apparatus comprising:
   a support surface for supporting the rear surface of the lead frame;
   a clamp plate having a clamping surface;
   urging means for urging the clamping surface of the clamp plate towards the front surface of the lead frame to clamp the lead frame; and
   peeling means for peeling the masking tape from the rear surface of the lead frame;
   the clamping surface being adapted to receive the or each resin body within at least one recess in the clamping surface.

7. An apparatus according to claim 6 in which the clamping surface is resilient, whereby the at least one recess is at least partly formed by deformation of the clamping surface as it is urged towards the front surface of the lead frame.

8. An apparatus according to claim 6 or claim 7 in which the clamping surface is re-shaped to include the at least one recess.

9. A method according to claim 6, or claim 7 in which the urging means includes control means for regulating the urging force to a predetermined value.

10. A method of removing a section of masking tape from a lead frame, the masking tape having a first surface adhered to a rear surface of the lead frame and extending in a first direction parallel to the rear surface of the lead frame, the method comprising:
    gripping an edge portion of the masking tape which is furthermost in the first direction,
    peeling the masking tape from the lead frame by moving the edge portion opposite to the first direction, whereby the first surface of the masking tape is turned to face away from the lead frame; and
    urging a retrieval surface of a retrieval plate against the first surface of the masking tape, whereby the masking tape becomes adhered to the retrieval surface.

11. A method according to claim 10 further comprising clamping the lead by urging a clamping surface of a clamp plate towards the front surface of the lead frame, the clamping surface receiving a resin body formed on a front surface of the lead frame within a recess in the clamping surface.

12. A method according to claim 10 in which said peeling is performed by:
    moving the edge portion of the tape relative to the lead frame by a predetermined distance in a direction having a fast component opposite to the first direction and a second component away from the surface; and
    moving the edge portion of the tape relative to the lead frame oppositely to the first direction, whereby the masking tape is gradually peeled from the rear surface of the lead frame.

13. A method of removing respective sections of masking tape from respective rear faces of a plurality of lead frames, each section of masking tape having a first surface adhered to the rear surface of the respective lead frame and extending in a first direction parallel to the rear surface of the lead frame, the method comprising:
    (i) gripping an edge portion of the masking tape of the first lead frame, the edge portion being furthermost in the first direction,
    (ii) peeling the masking tape from the first lead frame by moving the edge portion oppositely to the first direction, whereby the first surface of the masking tape is turned to face away from the lead frame;
    (iii) urging a retrieval surface of a retrieval plate towards the first surface of the masking tape, whereby the masking tape of the first lead frame becomes adhered to the retrieving surface; and (iv) repeating steps (i) to (iii) successively for the other lead frames, in each step (iii) the masking tape of the respective lead frame becoming adhered to the masking tape of the previous lead frame, whereby the masking tapes of the plurality of lead frames are successively stacked on the retrieval surface.

14. An apparatus for removing a section of masking tape from a lead frame, the masking tape having a first surface adhered to a rear surface of the lead frame and extending in a first direction parallel to the rear surface of the lead frame, the apparatus comprising:

a gripping device for gripping an edge portion of the masking tape which is furthermost in the first direction, peeling means for moving the gripping device opposite to the first direction, whereby the masking tape is peeled from the lead frame and its first surface is turned to face away from the lead frame;

a retrieval plate having a retrieval surface; and plate drive means for urging the retrieval surface of the retrieval plate towards the first surface of the masking tape.

15. An apparatus according to claim 14 in which the plate drive means reciprocates the retrieval plate perpendicularly to the rear surface of the lead frame.

16. An apparatus according to claim 14 or claim 15 further including drive means to move the retrieval plate reciprocally in, and opposite to, the first direction.

17. An apparatus according to claim 14 in which spring means are provided between the retrieval plate and the plate drive means for resiliently attaching the retrieval plate to the plate drive means.

18. An apparatus according to claim 14 further comprising clamping means for clamping the lead frame, the clamping means comprising:

a support surface for supporting the rear surface of the lead frame;

a clamp plate having a clamping surface; and urging means for urging the clamping surface of the clamp plate towards the front surface of the lead frame to clamp the lead frame;

the clamping surface being adapted to receive at least one resin body formed on a front surface of the lead frame within at least one recess in the clamping surface.

19. An apparatus according to claim 14 in which the peeling means includes:

first drive means for moving the gripping device relative to the lead frame by a predetermined distance in a direction having a first component opposite to the first direction and a second component away from the surface; and second drive means for moving the gripping device relative to the lead frame oppositely to the first direction, whereby the masking tape is gradually peeled from the rear surface of the lead frame.

* * * * *

UNITED STATES PATENT AND TRADEMARK OFFICE
CERTIFICATE OF CORRECTION

PATENT NO. : 6,656,320 B2
DATED : December 2, 2003
INVENTOR(S) : See Yap Ong et al.

It is certified that error appears in the above-identified patent and that said Letters Patent is hereby corrected as shown below:

Column 8,
Line 16, change "re-shaped" to -- pre-shaped --.
Line 46, change "fast" to -- first --.

Signed and Sealed this

Twenty-second Day of June, 2004

JON W. DUDAS
*Acting Director of the United States Patent and Trademark Office*